United States Patent
Womac et al.

(10) Patent No.: US 10,496,127 B1
(45) Date of Patent: Dec. 3, 2019

(54) MULTI-CHIP TIMING ALIGNMENT TO A COMMON REFERENCE SIGNAL

(71) Applicant: LINEAR TECHNOLOGY HOLDING LLC, Norwood, MA (US)

(72) Inventors: Michael Dean Womac, McKinney, TX (US); Jan-Michael Stevenson, Lucas, TX (US); Richard William Ezell, Lucas, TX (US)

(73) Assignee: LINEAR TECHNOLOGY HOLDING LLC, Norwood, MA (US)

( * ) Notice: Subject to any disclaimer, the term of this patent is extended or adjusted under 35 U.S.C. 154(b) by 0 days.

(21) Appl. No.: 15/997,557

(22) Filed: Jun. 4, 2018

(51) Int. Cl.
*G06F 1/12* (2006.01)
*H03L 7/089* (2006.01)
*H03L 7/199* (2006.01)
*G06F 1/10* (2006.01)

(52) U.S. Cl.
CPC .................. *G06F 1/12* (2013.01); *G06F 1/10* (2013.01); *H03L 7/0891* (2013.01); *H03L 7/199* (2013.01)

(58) Field of Classification Search
None
See application file for complete search history.

(56) References Cited

U.S. PATENT DOCUMENTS

| | | | | |
|---|---|---|---|---|
| 5,463,337 A * | 10/1995 | Leonowich | ........... | H03L 7/0812 327/113 |
| 5,771,264 A * | 6/1998 | Lane | ..................... | H03L 7/0995 327/158 |
| 6,127,865 A * | 10/2000 | Jefferson | .................... | G06F 1/10 327/149 |
| 6,140,854 A * | 10/2000 | Coddington | .............. | G06F 1/10 327/149 |
| 6,337,601 B1 * | 1/2002 | Klemmer | ................ | H03L 7/083 331/117 R |
| 6,687,320 B1 * | 2/2004 | Chiu | ......................... | G06F 1/08 327/156 |
| 6,859,109 B1 * | 2/2005 | Leung | ..................... | H03L 7/099 327/141 |
| 6,888,385 B2 * | 5/2005 | Bajaj | ......................... | G06F 1/10 327/147 |
| 7,368,961 B2 * | 5/2008 | Werner | ...................... | G06F 1/04 327/156 |
| 7,518,420 B1 * | 4/2009 | Stiff | ....................... | H03L 7/0995 327/156 |
| 9,564,913 B1 * | 2/2017 | Courcy | ................... | H04L 7/033 |

(Continued)

*Primary Examiner* — Cassandra F Cox
(74) *Attorney, Agent, or Firm* — Schwegman Lundberg & Woessner, P.A.

(57) ABSTRACT

The subject technology provides for removing a source of delay in a phase-locked loop (PLL) by causing the output rising edge to occur at the same time as the input rising edge. The subject technology replicates the amount of delay experienced along an input reference signal path to the PLL as close as possible using a same circuit configuration and bias circuits as in the input reference signal path. For example, a timing alignment circuit containing a replica circuit adds compensation delay to a negative feedback loop signal to match the feedback loop delay with the reference path delay. The delay of the reference signal path is estimated and added into the replica circuit. The delay characteristics of these two paths negate one another such that the phases of the input reference signal and the feedback loop signal become phase-locked at the input to the PLL.

23 Claims, 5 Drawing Sheets

(56) References Cited

U.S. PATENT DOCUMENTS

| | | | | |
|---|---|---|---|---|
| 9,602,115 B1* | 3/2017 | Rozental | ............... | H03L 7/0996 |
| 2003/0067331 A1* | 4/2003 | Drexler | ............... | H03L 7/0812 |
| | | | | 327/158 |
| 2005/0162200 A1* | 7/2005 | Haerle | ............... | H03L 7/0812 |
| | | | | 327/157 |
| 2005/0280407 A1* | 12/2005 | Loke | ............... | H03L 7/07 |
| | | | | 324/76.54 |
| 2006/0158263 A1* | 7/2006 | Goldberg | ............... | H03L 7/085 |
| | | | | 331/16 |
| 2007/0245221 A1* | 10/2007 | Lakkis | ............... | H03M 13/1505 |
| | | | | 714/783 |
| 2009/0079487 A1* | 3/2009 | Arnborg | ............... | H01L 27/092 |
| | | | | 327/285 |
| 2011/0234278 A1* | 9/2011 | Seo | ............... | H03L 7/0814 |
| | | | | 327/158 |
| 2012/0007639 A1* | 1/2012 | Park | ............... | G11C 7/222 |
| | | | | 327/142 |
| 2014/0002150 A1* | 1/2014 | Seo | ............... | H03L 7/095 |
| | | | | 327/156 |

* cited by examiner

MULTI-CHIP TIMING ALIGNMENT TO A COMMON REFERENCE SIGNAL

FIELD OF THE DISCLOSURE

The present description relates generally to clock generation systems, and more particularly, to multi-chip timing alignment to a common reference signal.

BACKGROUND

Synchronization of timing signals is expected, for instance, when aligning data sampling events in analog-to-digital converters that are driven by clock signals. Similarly, synchronization of timing signals is expected to phase-align different carrier radio waves to achieve constructive interference. There are many systems that expect—either because the number of clock signals they used or the spatial separations between the clocked devices therein—alignment of multiple clocking devices to a common time or phase.

SUMMARY OF THE DISCLOSURE

The subject technology provides for removing timing misalignment in a phase-locked loop (PLL) with clock distribution. The misalignment is removed such that the output rising edge to occur at the same time as the input rising edge. In this respect, any offset between the input rising edge and the output rising edge can be reduced by adding delay to the feedback loop of the PLL such that the added delay pushes/pulls the output rising edge to become aligned with the input rising edge. The subject technology replicates the amount of delay experienced along an input reference signal path to the PLL as close as possible using the same circuit configuration and bias circuits as in the input reference signal path. For example, a timing alignment circuit containing a replica circuit adds compensation delay to a negative feedback loop signal to match the feedback loop delay with the reference path delay. The delay of the reference signal path is estimated and added into the replica circuit. The delay characteristics of these two paths negate one another such that the phases of the input reference signal and the feedback loop signal become phase-locked at the input to the PLL.

According to an embodiment of the present disclosure, an apparatus for timing alignment to a common reference signal is provided. The apparatus includes a reference frequency divider circuit coupled to an input terminal and configured to receive a reference frequency signal, and to generate a frequency-divided reference signal along a reference signal path from the input terminal. The apparatus includes a phase-locked loop (PLL) circuit configured to receive the frequency-divided reference signal and to generate a frequency-divided feedback signal along a feedback signal path to an input to the PLL, and an output oscillation signal to an output terminal. The apparatus includes a timing alignment circuit coupled to the PLL circuit and configured to adjust a phase of the frequency-divided feedback signal with a predetermined amount of delay that is proportional to an amount of path delay through the reference signal path of the reference frequency divider circuit for aligning the frequency-divided reference signal to the frequency-divided feedback signal with the adjusted phase. In some aspects, the timing alignment circuit includes one or more delay components that replicate the amount of path delay through the reference signal path of the reference frequency divider circuit.

According to an embodiment of the present disclosure, a clock generation system includes a reference frequency divider circuit coupled to an input terminal and configured to receive a reference frequency signal and to provide a frequency-divided reference signal. The clock generation system includes a phase-locked loop (PLL) circuit configured to receive the frequency-divided reference signal and to generate a frequency-divided feedback signal along a feedback signal path to an input to the PLL and an output oscillation signal to an output terminal. The clock generation system includes a plurality of output frequency dividers configured to receive the output oscillation signal and to individually generate a frequency-divided output timing signal that is a function of a frequency of the reference frequency signal. The clock generation system includes a timing alignment circuit coupled to the PLL circuit and configured to adjust a phase of the frequency-divided feedback signal with a predetermined amount of delay that is proportional to an amount of path delay through a reference signal path of the reference frequency divider circuit for aligning the frequency-divided reference signal to the frequency-divided feedback signal with the adjusted phase. In some aspects, the timing alignment circuit includes one or more delay components that replicate the amount of path delay through the reference signal path of the reference frequency divider circuit.

According to an embodiment of the present disclosure, an apparatus for timing alignment to a common reference signal is provided. The apparatus includes means for receiving a reference frequency signal at an input terminal and providing a frequency-divided reference signal along a reference signal path from the input terminal. The apparatus includes means for receiving the frequency-divided reference signal and providing a frequency-divided feedback signal along a feedback signal path and an output oscillation signal to an output terminal. The apparatus includes means for replicating an amount of path delay from the input terminal through the reference signal path with one or more delay components arranged along the feedback signal path, adjusting a phase of the frequency-divided feedback signal with a predetermined amount of delay that is proportional to the amount of path delay through the reference signal path of the reference signal path and aligning the frequency-divided reference signal to the frequency-divided feedback signal with the adjusted phase such that a transition edge of the frequency-divided feedback signal is aligned with a transition edge of the frequency-divided reference signal.

BRIEF DESCRIPTION OF THE DRAWINGS

Certain features of the subject technology are set forth in the appended claims. However, for purposes of explanation, several embodiments of the subject technology are set forth in the following figures.

DETAILED DESCRIPTION

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, the subject technology is not limited to the specific details set forth herein and may be practiced using one or more implementations. In one or more instances, structures and components are shown in block diagram form in order to avoid obscuring the concepts of the subject technology.

Generally, a high frequency clocking signal may be synthesized from a lower frequency system reference signal ("reference signal $f_{REF}$") using a PLL. Often, using a PLL, a clock synthesizer creates a common high-frequency signal from the reference signal $f_{REF}$. The common high-frequency signal is then used to drive individual frequency dividers to produce multiple signals of different frequencies. Because of their digital nature, the signals from the frequency dividers may have random output phases when the dividers are first started. The PLL may also make use of digital frequency dividers that have random phase characteristics when the dividers are first started. The PLL can remove some, but not all, phase uncertainties. Clock synchronization is needed to consistently force a single predetermined phase relationship among the frequency dividers. However, temperature and technology process variations cause each of the output phases to drift from one another, thus creating a challenge to properly align the input phase with each of the output phases.

The subject disclosure provides for aligning many clock signals of a multi-chip clock distribution system to a common reference signal with little to no delay from the input of the PLL to the output of the PLL. As a result, since there is no delay, the input is aligned to the output. For example, the output rising edge occurs at the same time as the input rising edge. In effect, the subject technology reduces the effects of integrated circuit manufacturing process and large system temperature changes on the timing alignment to the common reference signal.

In some implementations, an apparatus for timing alignment to a common reference signal includes a reference frequency divider circuit coupled to an input terminal and configured to receive a reference frequency signal and to provide a frequency-divided reference signal along a reference signal path from the input terminal. The apparatus includes a phase-locked loop (PLL) circuit configured to receive the frequency-divided reference signal and to provide a frequency-divided feedback signal along a feedback signal path to an input to the PLL and an output oscillation signal to an output terminal. The apparatus includes a timing alignment circuit coupled to the PLL circuit and configured to adjust a phase of the frequency-divided feedback signal with a predetermined amount of delay that is proportional to an amount of path delay through the reference frequency divider circuit for aligning the frequency-divided reference signal to the frequency-divided feedback signal with the adjusted phase. In some aspects, the timing alignment circuit includes one or more delay components that replicate the amount of path delay through the reference frequency divider circuit.

Figure 1:
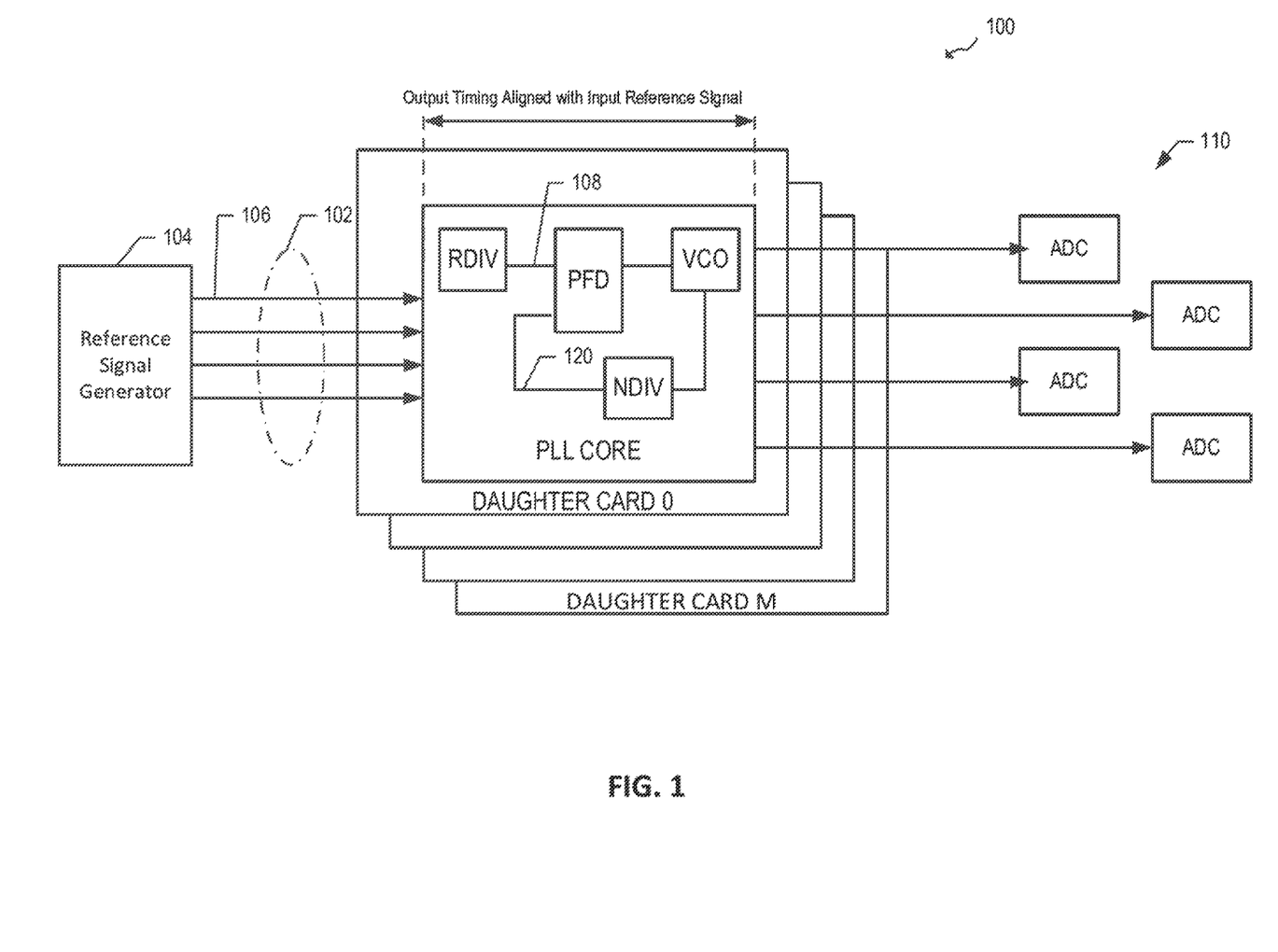
FIG. 1 illustrates a schematic diagram of an example of a clock generation system in accordance with one or more implementations of the subject technology.

FIG. 1 illustrates a schematic diagram of an example of a clock generation system 100 in accordance with one or more implementations of the subject technology. Not all of the depicted components may be used, however, and one or more implementations may include additional components not shown in the figure. Variations in the arrangement and type of the components may be made without departing from the spirit or scope of the claims as set forth herein. Additional components, different components, or fewer components may be provided.

In the depicted example, the clock generation system 100 includes multiple daughter cards coupled to a common reference distribution network 102, where each of the daughter cards includes a PLL that produces multiple timing signal outputs that are driven to respective load circuits (e.g., 110), such as analog-to-digital (ADC) circuits. In some examples, the ADC circuits are located on a main circuit board (e.g., motherboard), where each of the daughter cards plugs into the main circuit board to extend the clock generation circuitry. Each of the daughter cards may be a circuit (e.g., a circuit board) that includes a reference frequency divider circuit and the PLL on a common semiconductor die (or chip) in some implementations, or arranged on separate semiconductor dies with interconnected traces on the circuit board between the reference frequency divider circuit and the PLL in other implementations. In some implementations, daughter cards may not be used, and instead the clock generation system 100 includes a common circuit that plugs into the main circuit board, where the circuit includes multiple integrated circuit dies generating the different timing signal outputs.

The common reference distribution network 102 may include a reference signal generator 104 that produces a high quality reference frequency signal (e.g., 106) as it provides the frequency reference to the PLL. In some implementations, the reference frequency signal 106 is a sine wave, or a square wave with a predetermined slew rate in other implementations. The common reference distribution network 102 may drive the reference frequency signal 106 with differential signaling in some implementations, or single-ended signaling in other implementations. The clock generation system 100 allows synchronization across the multiple outputs and multiple chips (e.g., semiconductor dies). For example, the clock generation system 100 may include circuitry in a feedback loop (e.g., 120) of the PLL that facilitates alignment of the multiple outputs to the reference frequency signal input (e.g., 108). As used herein, the term "produce" may be interchangeable used with the term "generate" without departing from the scope of the present disclosure.

Figure 2:
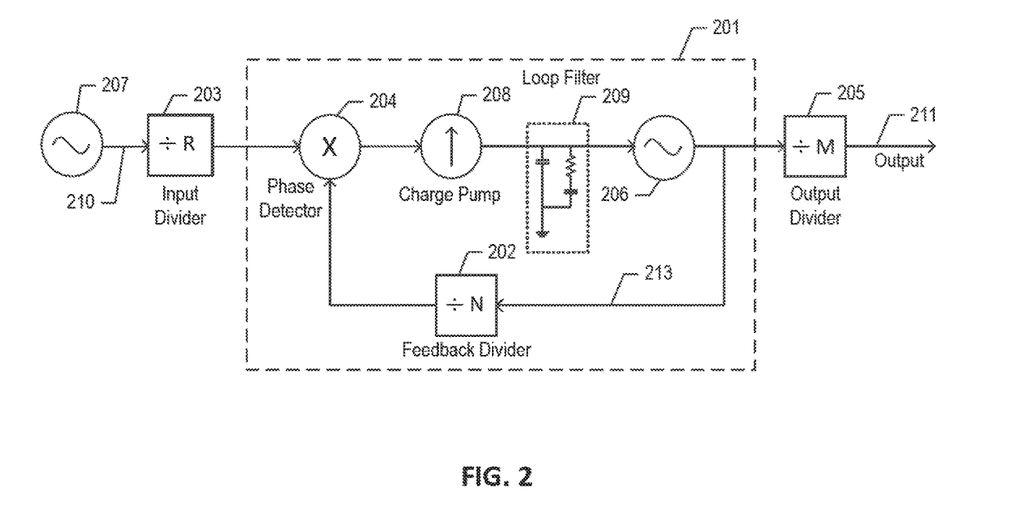
FIG. 2 illustrates a schematic diagram of an example of a clock generator circuit in accordance with one or more implementations of the subject technology.

FIG. 2 illustrates a schematic diagram of an example of a clock generator circuit 200 in accordance with one or more implementations of the subject technology. Not all of the depicted components may be used, however, and one or more implementations may include additional components not shown in the figure. Variations in the arrangement and type of the components may be made without departing from the spirit or scope of the claims as set forth herein. Additional components, different components, or fewer components may be provided.

In some implementations, the clock generator circuit 200 is, or at least a part of, a PLL core 201. The clock generator circuit 200 includes a voltage controlled oscillator (VCO) 206, a feedback frequency divider 202, a reference frequency divider 203, a phase detector 204 and an output frequency divider 205. In FIG. 2, the clock generator circuit 200 uses a feedback signal $f_{VCO}$ (e.g., 213) to align the phase of the VCO 206 to the phase of an incoming frequency reference signal $f_{REF}$ along a reference path. As shown, the feedback signal $f_{VCO}$ 213 is output from the VCO 206 to drive the feedback frequency divider 202, which has a frequency division ratio N. In some aspects, the feedback frequency divider 202 is referred to as an "N-divider" or a "feedback divider." The feedback frequency divider 202 is configured to generate a frequency-divided feedback signal, where the frequency-divided feedback signal is N times less in frequency than the feedback signal $f_{VCO}$ 213. The frequency reference signal $f_{REF}$ (e.g., 210) is provided to the reference frequency divider 203, which has a frequency division ratio R. The reference frequency divider 203 is referred to as a "R-divider" or a "reference divider." The reference frequency divider 203 is configured to generate a frequency-divided reference signal, where the frequency-divided reference signal is R times less in frequency than the frequency reference signal $f_{REF}$ 210. The divide ratio R may be equal to "1" in some implementations.

In some implementations, element 203 is configured as a reference frequency multiplier, where the frequency reference signal $f_{REF}$ (e.g., 210) represents an additional frequency multiplication provided by the reference frequency multiplier (e.g., 203). In this respect, the reference frequency multiplier (e.g., 203) increases the frequency of the frequency reference signal $f_{REF}$ (e.g., 210) by a factor of M, where M=2 (e.g., multiplies by 2).

In some aspects, the reference frequency divider 203 includes one or more reference input buffers and a reference divider latch (or flip flop). The phase detector 204 compares the output signals of the R-divider (e.g., the frequency-divided reference signal) and the N-divider (e.g., the frequency-divided feedback signal) to adjust the frequency of the VCO 206 so as to align the phases of the output signals of the R-divider and the N-divider. In some implementations, the VCO 206 operates with a frequency in a range of 4 GHz to 5 GHz, or with a frequency greater than 5 GHz in other implementations. In steady state, the feedback signal $f_{VCO}$ (e.g., 213) and the reference signal $f_{REF}$ (e.g., 210) are related by:

$$f_{VCO} = f_{REF} \times \frac{N}{R} \qquad \text{Eq. (1)}$$

The phase detector 204, in conjunction with a charge pump 208, produces source and sink current pulses proportional to the phase difference between the outputs of the R and N dividers. This action provides the feedback to phase-lock the loop, forcing a phase alignment at the inputs of the phase detector 204.

In FIG. 2, the output signal four (e.g., 211) represents an additional frequency division provided by the output frequency divider 205, which reduces the frequency of the output signal $f_{OUT}$ (e.g., 211) by a factor of M, where $$f_{OUT} = f_{REF} \times \frac{N}{R \times M} \qquad \text{Eq. (2)}$$

In some implementations, element 205 is configured as an output frequency multiplier, where the output signal (e.g., 211) represents an additional frequency multiplication provided by the output frequency multiplier (e.g., 205). In this respect, the output frequency multiplier (e.g., 205) increases the frequency of the output signal four (e.g., 211) by a factor of M, where M=2 (e.g., multiplies by 2). The uncertainty of the starting state of the reference frequency divider 203 (i.e., the R-divider) causes the phase of the feedback signal $f_{VCO}$ (e.g., 213) relative to the reference signal $f_{REF}$ (e.g., 210) to be indeterminate. An additional degree of phase uncertainty is in the output signal $F_{OUT}$ (e.g., 211), due to the output frequency divider 205.

The output signal of a digital frequency divider has one of K possible phases for a given frequency division ratio K. For K=1, there is no phase uncertainty, as there is only one phase possibility. Phase uncertainty occurs when K is greater than or equal to 2. Thus, to provide a deterministic phase relationship between $f_{VCO}$ and $f_{REF}$, the R-divider has a known phase at a known time.

As shown in FIG. 2, there are blocks prior to the phase detector 204. Those blocks can have varying phase delays. The overall state of the art for clock timing system includes a situation of aligned input-to-output phases. In the depicted example, the frequency reference signal $f_{REF}$ (e.g., 210) is the input phase, and the output signal $f_{OUT}$ (e.g., 211) is the output phase. In other systems that do not align any of the delays in front of the phase detector 204, or match the delays in front of the phase detector 204, there is an amount of uncertainty between the frequency reference signal 210 and the output signal 211. The amount of uncertainty can be in the order of nanoseconds, or in the order of picoseconds in other implementations, but there may be a random mismatch between those two inputs because of the varying amounts of delay at the input to the phase detector 204.

In some approaches, taking feedback at the output may produce undesirable results. For example, the output terminal and input to the phase detector 204 may be at very different physical portions of the chip. The distance going from an output all the way back to the phase detector 204 can be rather large and difficult to drive. The distance itself can introduce uncertainties due to the speed of light such as the delay through the transmission line on the chip itself. The fact that another block is being driven with the output signal can create a load on that output. In some aspects, physically taking the feedback at that point introduces other undesired problems in the system. Second, the delays through the R divider and the N divider, or whichever blocks are in between the two elements to be aligned in phase, can have different delay characteristics themselves. As an example, consider the time an R-Divider (e.g., 203) receives its input clock to when its output changes, that time can be different than the equivalent in the N-Divider (e.g., 202). Typically, the N-Divider (e.g., 202) operates faster, so it would react faster to an input change at its output.

Moreover, integrated circuit manufacturing process and large system temperature changes have an adverse effect on the timing alignment to a common reference signal for phase-locked loops. In some approaches, timing alignment may be achieved by connecting the output of an output frequency divider back inside the loop. In this respect, the loop corrects for the delay at the output such that the reference path delay equals the feedback divider path delay, which is unlikely due to significantly different architectures implemented to their different functionality. Also, the architecture of this approach removes the functionality of being able to have programmable delay added to its output.

Figure 3:
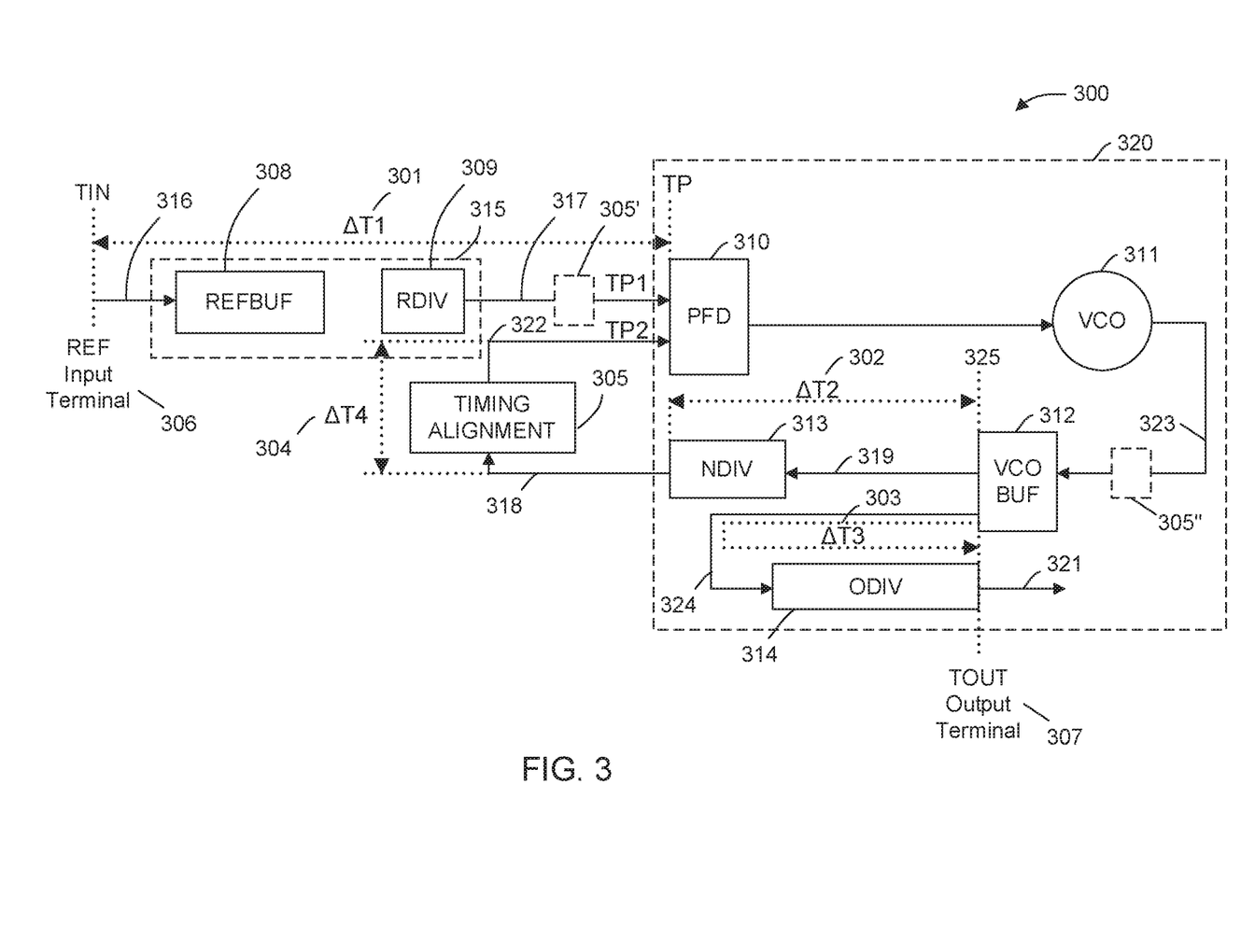
FIG. 3 conceptually illustrates an example of a clock generator circuit with a depiction of path delays in accordance with one or more implementations of the subject technology.

FIG. 3 conceptually illustrates an example of a clock generator circuit 300 with a depiction of path delays in accordance with one or more implementations of the subject technology. Not all of the depicted components may be used, however, and one or more implementations may include additional components not shown in the figure. Variations in the arrangement and type of the components may be made without departing from the spirit or scope of the claims as set forth herein. Additional components, different components, or fewer components may be provided.

The clock generator circuit 300 includes a reference buffer 308 and a reference divider 309 (collectively referred to as "the reference frequency divider circuit 315"). The clock generator circuit 300 includes a PLL circuit 320 formed with a phase detector 310, a VCO circuit 311, a VCO buffer 312, a feedback divider circuit 313 (referred to as "NDIV"), an output divider 314 (referred to as "ODIV"), and a timing alignment circuit 305. In some aspects, the PLL circuit 320 is, or includes a portion of, the PLL core 201 (FIG. 2).

In FIG. 3, the delay of the reference signal path is compensated by a programmable delay (e.g., provided by the timing alignment circuit 305). In this respect, the timing alignment circuit 305 reduces the offset between the input phase of the frequency reference signal $f_{REF}$ 210 and the output phase of the feedback signal $f_{VCO}$ 213 by adding a programmable delay provided by the timing alignment circuit 305 (e.g., $\Delta T4$) to the negative feedback loop of the PLL core 201 to compensate for the delay (e.g., $\Delta T1$) on the reference signal path 301. The timing from the input to the output can be expressed as:

$$TOUT = TIN + \Delta T1 - \Delta T4 - \Delta T2 + \Delta T3 \qquad \text{Eq. (3)}$$

where TOUT is the time at the output terminal, TIN is the time at the input terminal, $\Delta T1$ is the propagation delay of the reference signal path, $\Delta T4$ is the propagation delay of the timing alignment circuit 305, $\Delta T2$ is the propagation delay of the feedback divider signal path (e.g., 302), and $\Delta T3$ is the propagation delay of the output divider signal path (e.g., 303). In some aspects, the propagation delays (e.g., $\Delta T1$, $\Delta T2$, $\Delta T3$, $\Delta T4$) are determined by an offline timing regression analysis during a manufacturing process, and the measured values may be stored in a external repository for defining the delay characteristics of the timing alignment circuit 305. As used herein, the $\Delta T1$ is referred to as a delta delay 301, the $\Delta T2$ is referred to as a delta delay 302, the $\Delta T3$ is referred to as a delta delay 303, and the $\Delta T4$ is referred to as a delta delay 304. In order to synchronize the input with the output, the timing is expressed as:

$$TOUT = TIN \qquad \text{Eq. (4)}$$

In order to achieve the near zero delay between the input and the output, the timing is expressed as:

$$0 = \Delta T1 - \Delta T4 - \Delta T2 + \Delta T3, \text{ if } TOUT = TIN \qquad \text{Eq. (5)}$$

Additionally, the programmable delay captures delay differences that may exist in the reference signal path (e.g., 301), NDIV (e.g., 313), and ODIV (e.g., 314) to maintain a near zero delay. In this respect, the timing to replicate the amount of net delay across the different signal paths can be expressed as:

$$\Delta T4 = \Delta T1 - (\Delta T2 - \Delta T3) \qquad \text{Eq. (6)}$$

In the depicted example, the timing alignment circuit 305 replicates the delay of the reference signal path (e.g., 301) expressed as $\Delta T1$ and the delay difference between $\Delta T2$ and $\Delta T3$ using respective delay components that mimic the delay components found in these signal paths.

The reference frequency divider circuit 315 is coupled to an input terminal 306 (TIN) and configured to receive a reference frequency signal (e.g., 316) and provide a frequency-divided reference signal (e.g., 317) along a reference signal path (e.g., 301) to a first input (e.g., TP1) of the phase detector 310. The PLL circuit 320 is configured to receive the frequency-divided reference signal 317 and provide a frequency-divided feedback signal (e.g., 322) along a feedback signal path (e.g., 318) to a second input (e.g., TP2) of the phase detector 310 and an output oscillation signal (e.g., 319) to an output terminal (e.g., 307). The timing alignment circuit 305 is coupled to the PLL circuit 320 and configured to align the frequency-divided feedback signal 322 in the PLL circuit 320 with the frequency-divided reference signal 317 such that the phase of the output oscillation signal 319 aligns with the phase of the reference frequency signal 316. In some aspects, the timing alignment circuit 305 includes one or more delay components that replicate an amount of path delay through the reference frequency divider circuit 315.

In some aspects, the PLL circuit 320 includes an error detector circuit (e.g., 310) that is configured to receive the frequency-divided reference signal 317 and the frequency-divided feedback signal 322 to provide an error signal based on a comparison between the frequency-divided reference signal 317 and the frequency-divided feedback signal 322. In some aspects, the error detector circuit is, or a part of, the phase detector 310. The VCO circuit 311 is configured to receive the error signal and produce the output oscillation signal 323. The VCO buffer 312 generates a duplicate signal 319 and 324. The feedback divider circuit 313 is configured to receive the output oscillation signal 323 from the VCO buffer 312 and produce the frequency-divided feedback signal 322 along the feedback signal path to the phase detector 310. In some aspects, the timing alignment circuit 305 is coupled to the second input (e.g., TP2) to the phase detector 310.

In some implementations, the clock generator circuit 300 includes the output divider circuit (e.g., 314) coupled to an output of the VCO buffer 312. In the depicted example, the output divider circuit 314 is configured to produce a frequency-divided output timing signal (e.g., 321) from the output oscillation signal (e.g., 324) from a common reference point 325 coupled to an output of the VCO buffer 312, in which the output divider circuit 314 reduces the frequency of the output oscillation signal 324 by a factor of M, where M≥1. As depicted in FIG. 3, the common reference point 325 is a time aligned point for the feedback divider circuit 313 and the output divider circuit 314. In some aspects, a path delay (e.g., $\Delta T2$) from the output of the VCO buffer 312 through the output divider circuit 314 is substantially equivalent to a path delay (e.g., $\Delta T3$) from the output of the VCO buffer 312 through the feedback divider circuit 313 such that the two path delays negate one another to achieve a zero delay difference between the two signal paths.

In some aspects, the reference frequency divider circuit 315 is coupled to the input terminal 306 (e.g., TIN) and the first input to the error detector circuit (e.g., TP1). The reference frequency divider circuit (e.g., 315) provides the frequency-divided reference signal 317 along the reference signal path 301 between the input terminal 306 (e.g., TIN) and the first input of the error detector circuit (e.g., TP1). In some aspects, the feedback divider circuit (e.g., 313) is coupled to an output of the VCO buffer 312 and an input to the timing alignment circuit 305. The feedback divider circuit provides the frequency-divided feedback signal 322 along the feedback divider signal path between the output of the VCO buffer 312 and the input to the timing alignment circuit 305. In other aspects, the output divider circuit 314 is coupled to the output terminal 307 (e.g., TOUT) and provides the output oscillation signal 321 along an output divider signal path at the output terminal 307. In the depicted example, to synchronize the output phase to the input phase, the timing alignment circuit 305 with the delta delay 304 compensates for a delay of the reference signal path (illustrated by the delta delay 301) and a timing difference between the feedback divider signal path (illustrated by the delta delay 302) and the output divider signal path (illustrated by the delta delay 303) by determining the net delay across these delta delays and offsetting this net delay with a replicated delay to thereby cancel any delay between the input and the output.

The timing alignment circuit 305 is configured to produce the path delay 304 by replicating the delay components (e.g., $\Delta T1$, $\Delta T2$, $\Delta T3$) found in the other signal paths that produce a net delay. This net delay causes the offset between the input phase and the output phase of the clock generator circuit 300. The path delay 304 is configured to negate the net delay produced by the path delays 301, 302 and 303, which cause the output phase to become offset relative to the input phase. The added path delay 304 shifts the output phase produced by the feedback divider circuit 313 by a predetermined amount that corresponds to the amount of net delay produced by the other signal paths such that the phase detector 310 receives the frequency-divided reference signal 317 phase-locked with the frequency-divided feedback signal 322.

In some implementations, the timing alignment circuit 305 (illustrated as 305' in FIG. 3) is coupled between the input terminal 306 and the first input (e.g., TP1) of the error detector circuit (e.g., 310). In some implementations, the timing alignment circuit 305 is coupled between the output of the VCO circuit 311 and the second input (e.g., TP2) to the error detector circuit (e.g., 310). In some implementations, the timing alignment circuit 305 is coupled to an output of the feedback divider circuit 313 and to the second input (e.g., TP2) of the error detector circuit (e.g., 310). In other implementations, the timing alignment circuit (illustrated as 305" in FIG. 3) is coupled to the output of the VCO buffer 312 and to an input to the feedback divider circuit 313.

In FIG. 3, the signaling still travels through the forward loop of the PLL circuit 320 and continues from the phase detector 310, and through a loop filter (not shown). The signal has a DC voltage that charges the VCO circuit 311. The VCO circuit 311 produces a time-varying frequency signal at the output of the VCO circuit 311, then fed to the VCO buffer 312, which then drives the time-varying frequency signal to the feedback divider circuit 313 directly. In this example, the output divider 314 is not part of the feedback as in the prior approach. The negative feedback loop directly observes the delay and compensates for them. The system, through the feedback, makes them align.

The delta-T delays represent the propagation delays from the input to the output of each block. These are the propagation delays that are attempting to be compensated to achieve a zero delay in the system. In some aspects, the frequency of the reference frequency signal 316 at the input terminal 306 (e.g., TIN) is reduced to a lower frequency by the reference frequency divider 309, of which the phase of that signal is aligned to the phase of the output signal (e.g., 321) of the output divider 314 at the output terminal 307 (or TOUT). The loop through the negative feedback of the PLL circuit 320 aligns frequencies at the input to the phase detector 310, represented by TP1, TP2. In one or more implementations, the timing alignment circuit 305 compensates for any delay differences in each of the blocks (e.g., $\Delta T4=\Delta T1-(\Delta T2-\Delta T3)$). In some aspects, the timing alignment circuit 305 adds a compensation delay to match the feedback loop delay with the reference path delay (e.g., $\Delta T4=\Delta T1$).

In some implementations, the timing alignment circuit 305 can be at the output of the feedback divider circuit 313 operating at a first frequency, or may be at the input of the feedback divider circuit 313 operating at a second frequency in other implementations, where the second frequency is greater than the first frequency. At the input of the feedback divider circuit 313, the frequency response of the delay components in the timing alignment circuit 305 may change because the timing alignment circuit 305 may be operating at a higher frequency compared to the timing alignment circuit 305 being at the output of the feedback divider circuit 313.

In some implementations, the delay is added into the reference signal path (e.g., 301) instead of the feedback signal path (e.g., 318). This situation would arise when the reference delay (e.g., $\Delta T1$) is less than the feedback delay (e.g., $\Delta T2$). For example, the timing alignment circuit 305 would be added into the reference path when the R divider delay is less than the feedback delay or when there is no R divider delay present on the reference signal path. The amount of delay experienced along a feedback signal path (e.g., 318) to the PLL (e.g., 320) is replicated as close as possible using the same circuit configuration and bias circuits as in the feedback signal path (e.g., 318). For example, the timing alignment circuit 305 containing a replica circuit adds compensation delay to an input reference signal (e.g., 317) to match the reference path delay ($\Delta T1$) with the feedback loop delay (e.g., $\Delta T2$). The delay of the feedback signal path (e.g., 318) is estimated and added into the replica circuit. The delay characteristics of these two paths negate one another such that the phases of the input reference signal (e.g., 317) and the feedback loop signal (e.g., 318) become phase-locked at the input to the PLL.

In some implementations, if the added compensation delay by the timing alignment circuit 305 is negative, the timing alignment circuit 305 can be arranged on the R divider path (e.g., along a path containing the reference buffer 308 and the reference divider 309). For example, the timing alignment circuit 305 can be coupled between the output of the reference divider 309 and the error detector 310. If the timing alignment circuit 305 is arranged on the reference path, instead of having to match the R divider delays, the timing alignment circuit 305 may replicate the feedback divider circuit 313 delays.

In some implementations, there is no reference divider present along the reference signal path (e.g., 301) from the reference input terminal (e.g., 306) to the PLL (e.g., 320). In this case, the timing alignment circuit 305 is arranged on the reference signal path (e.g., 301) and the system then directly uses the reference input frequency as the reference frequency.

In FIG. 3, the output divider 314, which is represented by $\Delta T3$ (or delta delay 303). The timing alignment circuit 305 can account for a net delay between the delta delay 302 and the delta delay 303. In the depicted example, if the delta delay 303 changes from what is expected, the timing alignment circuit 305 may not know that change because the negative feedback loop to the phase detector 310 is not coupled to the output divider circuit 314 and, thus, is not observing the propagation delay produced by the output divider circuit 314. The system relies on a certain repeatability of delays determined from the manufacturing process. As long as that delay has understandable (or predictable) characteristics over time and over temperature, the system can be programmed with the same sort of characteristics in the timing alignment circuit 305. For instance, if any of these delays had non-linear temperature characteristics, the same temperature compensation can be programmed into the timing alignment circuit 305. On the other hand, if the delays had varying voltage characteristics (such as a power supply causing changes in the delay), then the system can program the same voltage varying characteristics into the timing alignment circuit 305 to compensate.

Figure 4:
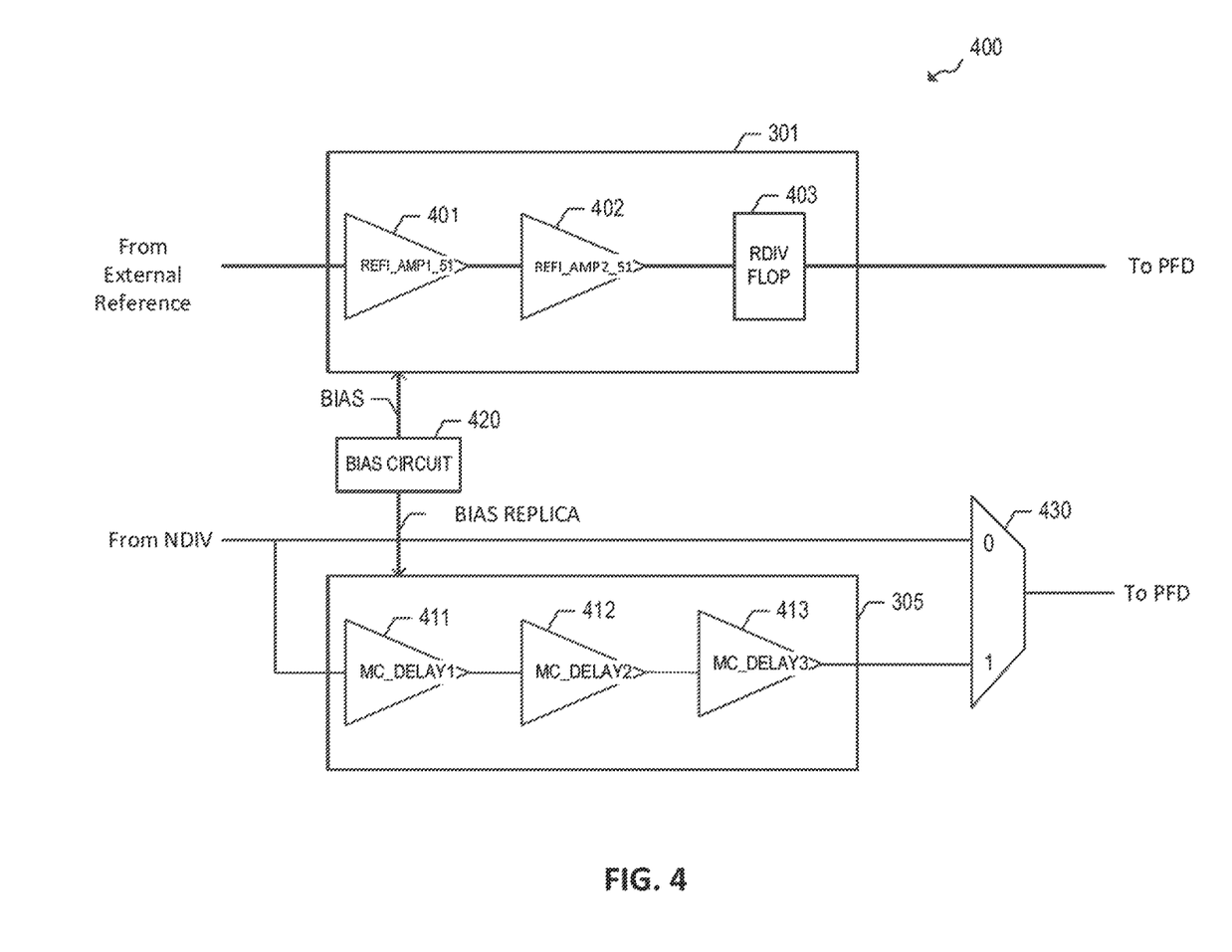
FIG. 4 conceptually illustrates an example of a clock generator circuit with reference path circuitry and replica circuitry for timing alignment in accordance with one or more implementations of the subject technology.

FIG. 4 conceptually illustrates an example of a clock generator circuit 400 with reference path circuitry and replica circuitry for timing alignment in accordance with one or more implementations of the subject technology. Not all of the depicted components may be used, however, and one or more implementations may include additional components not shown in the figure. Variations in the arrangement and type of the components may be made without departing from the spirit or scope of the claims as set forth herein. Additional components, different components, or fewer components may be provided.

The timing alignment circuit 305 is replicated from the reference path delay circuit such that individual components in the timing alignment circuit 305 mimic the respective individual delay components in the reference signal path. In FIG. 4, the top portion of the clock generator circuit 400 shows the reference signal path and its fundamental delay blocks (e.g., 301). These blocks represent dominant contributors to the overall delay of the reference signal path. In some aspects, the output divider 314 may contribute to the overall delay by having a time difference relative to the delta delay 302 (FIG. 3). Although the delay contributed by the output divider 314 is not a dominant component of the overall delay, its delay is still accounted for and added to one of the delay components. The delay is estimated and added into the replica circuit. The bottom portion of the clock generator circuit 400 shows the basic block diagram for the implementation of the timing alignment circuit 305. For example, the first replica circuit component 411 (e.g., MC_DELAY1) has characteristics of the first reference signal path component 401 (e.g., REFI_AMP1_51 amplifier). In another example, the second reference signal path component 402 (e.g., REFI_AMP2_51 amplifier) has its corresponding copy such as the second replica circuit component 412 (e.g., MC_DELAY2). The third replica circuit component 413 (e.g., MC_DELAY3) has an effective copy of the delay of the third reference signal path component 403 (e.g., R-DIV FLOP).

To generalize, whichever block that is in the path to create the output signal or reference signal, the same type of delay component can be employed in the timing alignment circuit 305. In some aspects, the delay components can be generalized high-speed logic functions. In other aspects, the delay components can be flip-flops, amplifiers, NAND logic gates, or NOR logic gates.

Each of the timing alignment circuit 305 blocks can be changed to make them more or less sensitive to different parameters. The generalized concept of timing alignment to a common reference signal is irrelevant of process specifics. In this respect, the process technology can be CMOS, Bipolar, Gallium Arsenide, etc. The specifics on how to compensate for those different parameters would be specific to the process technology. For a CMOS process, for example, there may be an imbalance between NMOS/PMOS transistors to compensate for that problem in another block. In another example, in a bipolar process, the transistors may be made larger or smaller, and the capacitance can be added to them to compensate for temperature variations.

In some aspects, the subject system includes a multiplexer 430 coupled to the output of the feedback divider circuit 313 and the output of the timing alignment circuit 305 to select between the delay compensated path (provided by the timing alignment circuit 305) and the uncompensated path (provided from the feedback divider circuit 313). An end user may decide to select one of these two signal paths for a select purpose. For example, in the manufacturing process, the timing alignment path would be selected for testing purposes. The addition of delay to a signal path may produce undesirable results from a noise standpoint in the phase-locked loop. This is because any additions to the signal path can cause additional thermo-noise feedback, which can degrade the overall noise performance of the PLL. The bypass path allows the end user to trade off their noise requirement if that requirement is more important than matching the delay for input/output synchronization. The capability to switch between the two signal paths can facilitate in determining the performance differences between the signal path with the added delay and the signal path without the added delay. In some aspects, the multiplexer 430 is configured to bypass a delay compensation output signal from the timing alignment circuit 305 and pass the frequency-divided feedback signal (e.g., 322) to the phase detector 310 based on a received select signal. In some aspects, the received select signal is a control signal driven by an external source (e.g., a terminal located off-chip).

The clock generator circuit 400 includes a bias circuit 420 coupled to the delay components in each of the reference signal path and the timing alignment circuit 305. In the depicted example, the bias circuit 420 is coupled to the reference frequency divider circuit 315 (e.g., including the reference buffer 308 and the reference divider 309) and the timing alignment circuit 305. The bias circuit 420 is configured to drive the same biasing signals to the reference frequency divider circuit and the timing alignment circuit 305. The bias circuit 420 is configured to generate biasing signals based on predetermined temperature and/or process variations and to drive the biasing signals to respective input control terminals of the one or more delay components of the timing alignment circuit 305. In some aspects, each of the biasing signals is driven with a first bias voltage that corresponds to a second bias voltage sent to a corresponding delay component on the reference signal path.

The bias circuit 420 is configured to place the delay components (e.g., comprised of transistors) into a known operating point. Amplifiers vary the conditions on their transistors and make the transistors change in current from one to zero (from an AC standpoint). In a DC standpoint, the transistors need to be placed into a steady state point. The bias circuit 420 is configured to place the transistors into an operating point, so the transistors can receive the signal and do the operation to which they are designed. For example, the bias circuit 420 ensures the timing alignment circuit 305 and reference frequency divider circuit 315; both receive the same variation over supply and temperature. As the bias varies in one block, the bias circuit 420 sends a bias signal (e.g., BIAS REPLICA) to vary the other block in the same manner. In this respect, when there are changes over temperature, both blocks have the same driving bias signal so they would respond in the same manner. On a CMOS process, the bias circuit 420 can drive gate signals to cause a certain amount of current to flow in each amplifier. In a bipolar process, the bias can control certain base terminals of each amplifier (each NAND gate) to control the current in the amplifiers (or NAND gates).

For example, a first bias signal (e.g., BIAS signal) is connected to the first reference signal path component (e.g., REFI_AMP1_51 amplifier), and a second bias signal (e.g., BIAS REPLICA signal) is connected to the first replica circuit component (e.g., MC_DELAY1). In this example, the BIAS signal would drive a current of 1 mA to the first reference signal path component as its normal operation. If the system attempts to match the same variations with the timing alignment circuit 305, and instead it is normally operating with 2 mA, then those two delays would not match. Instead, if the same bias were used, they would have similar delay characteristics.

Figure 5:
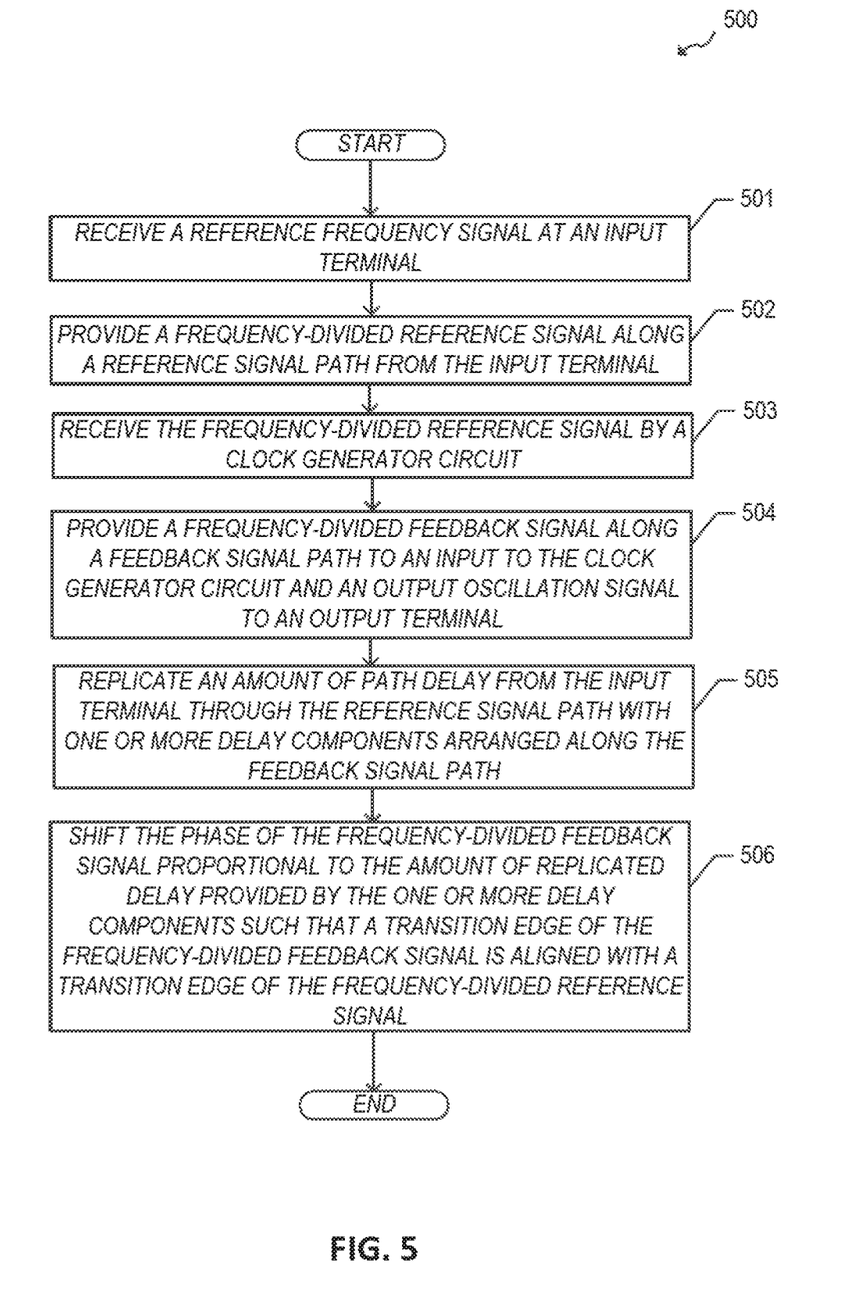
FIG. 5 illustrates a flow chart of an example process for timing alignment to a common reference signal in accordance with one or more implementations of the subject technology.

FIG. 5 illustrates a flow chart of an example process 500 for timing alignment to a common reference signal in accordance with one or more implementations of the subject technology. Further for explanatory purposes, the blocks of the sequential process 500 are described herein as occurring in serial, or linearly. However, multiple blocks of the process 500 may occur in parallel. In addition, the blocks of the process 500 need not be performed in the order shown and/or one or more of the blocks of the process 500 need not be performed.

The process 500 starts at step 501, where a reference frequency signal is received at an input terminal. Next, at step 502, a frequency-divided reference signal is provided along a reference signal path to a clock generator circuit. Subsequently, at step 503, the frequency-divided reference signal is received by the clock generator circuit. Next, at step 504, a frequency-divided feedback signal is provided along a feedback signal path and an output oscillation signal is provided to an output terminal. Subsequently, at step 505, an amount of path delay from the input terminal through the reference signal path is replicated with one or more delay components arranged along the feedback signal path.

Next, at step 506, the phase of the frequency-divided feedback signal is shifted proportional to the amount of replicated delay provided by the one or more delay components such that a transition edge of the frequency-divided feedback signal is aligned with a transition edge of the frequency-divided reference signal.

In some implementations, the phase of the frequency-divided reference signal is shifted proportional to the amount of replicated delay provided by the one or more delay components such that a transition edge of the frequency-divided reference signal is aligned with a transition edge of the frequency-divided feedback signal when the timing alignment circuit (e.g., 305) is added into the reference signal path.

In other implementations, the phase of the reference frequency signal is shifted proportional to the amount of replicated delay provided by the one or more delay components such that a transition edge of the reference frequency signal is aligned with a transition edge of the frequency-divided feedback signal when there is no R divider circuit present on the reference signal path and the timing alignment circuit (e.g., 305) is added into the reference signal path.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

The predicate words "configured to", "operable to", and "programmed to" do not imply any particular tangible or intangible modification of a subject, but, rather, are intended to be used interchangeably. For example, a processor configured to monitor and control an operation or a component may also mean the processor being programmed to monitor and control the operation or the processor being operable to monitor and control the operation. Likewise, a processor configured to execute code can be construed as a processor programmed to execute code or operable to execute code.

A phrase such as an "aspect" does not imply that such aspect is essential to the subject technology or that such aspect applies to all configurations of the subject technology. A disclosure relating to an aspect may apply to all configurations, or one or more configurations. A phrase such as an aspect may refer to one or more aspects and vice versa. A phrase such as a "configuration" does not imply that such configuration is essential to the subject technology or that such configuration applies to all configurations of the subject technology. A disclosure relating to a configuration may apply to all configurations, or one or more configurations. A phrase such as a configuration may refer to one or more configurations and vice versa.

The word "example" is used herein to mean "serving as an example or illustration." Any aspect or design described herein as "example" is not necessarily to be construed as preferred or advantageous over other aspects or designs.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for." Furthermore, to the extent that the term "include," "have," or the like is used in the description or the claims, such term is intended to be inclusive in a manner similar to the term "comprise" as "comprise" is interpreted when employed as a transitional word in a claim.

What is claimed is:

1. An apparatus for timing alignment to a common reference signal, the apparatus comprising:
   a reference frequency divider circuit coupled to an input terminal and configured to receive a reference frequency signal, and to generate a frequency-divided reference signal along a reference signal path from the input terminal;
   a phase-locked loop (PLL) circuit configured to receive the frequency-divided reference signal and to generate a frequency-divided feedback signal along a feedback signal path to an input to the PLL, and an output oscillation signal to an output terminal; and a timing alignment circuit coupled to the PLL circuit and comprising a delay component that replicates an amount of path delay through the reference signal path, wherein the timing alignment circuit is configured to adjust a phase of the frequency-divided feedback signal with a specified amount of delay that is proportional to the amount of path delay through the reference signal path to align the frequency-divided reference signal to the frequency-divided feedback signal.

2. The apparatus of claim 1, wherein the PLL circuit comprises:
an error detector circuit configured to receive the frequency-divided reference signal and a frequency-divided feedback signal to provide an error signal;
a voltage controlled oscillator (VCO) circuit configured to receive the error signal and generate the output oscillation signal based on the error signal; and
a feedback divider circuit configured to receive the output oscillation signal from the VCO circuit and produce the frequency-divided feedback signal along the feedback signal path to the error detector circuit,
wherein the timing alignment circuit is coupled to an input to the error detector circuit.

3. The apparatus of claim 2, further comprising:
an output divider circuit coupled to an output of the VCO circuit and configured to generate a frequency-divided output timing signal based on the output oscillation signal from the VCO circuit,
wherein a path delay from the output of the VCO circuit through the output divider circuit corresponds to a path delay from the output of the VCO circuit through the feedback signal path of the feedback divider circuit.

4. The apparatus of claim 3, wherein:
the reference frequency divider circuit is coupled to the input terminal and a first input to the error detector circuit, the reference frequency divider circuit providing the reference signal path between the input terminal and the first input of the error detector circuit,
the feedback divider circuit is coupled to the output of the VCO circuit and an input to the timing alignment circuit, the feedback divider circuit providing the frequency-divided feedback signal through the feedback signal path between the output of the VCO circuit and the input to the timing alignment circuit,
the output divider circuit is coupled to an output terminal and provides the output oscillation signal through an output divider signal path between the output of the VCO circuit and the output terminal, and
the timing alignment circuit compensates for a delay of the reference signal path and a timing difference between the feedback signal path and the output divider signal path.

5. The apparatus of claim 4, wherein the timing alignment circuit is coupled between the input terminal and the first input of the error detector circuit.

6. The apparatus of claim 4, wherein the timing alignment circuit is coupled between an output of the VCO circuit and a second input to the error detector circuit.

7. The apparatus of claim 6, wherein the timing alignment circuit is coupled to an output of the feedback divider circuit and to the second input of the error detector circuit.

8. The apparatus of claim 6, wherein the timing alignment circuit is coupled to the output of the VCO circuit and to an input to the feedback divider circuit.

9. The apparatus of claim 2, wherein the PLL circuit comprises:
a multiplexer coupled to the feedback divider circuit and the timing alignment circuit, wherein the multiplexer is configured to bypass a delay compensation output signal from the timing alignment circuit and pass the frequency-divided feedback signal to the error detector circuit based on a received select signal.

10. The apparatus of claim 1, wherein the more delay component in the timing alignment circuit corresponds to one of a plurality of delay components along the reference signal path.

11. The apparatus of claim 1, further comprising:
a bias circuit coupled to the reference frequency divider circuit and the timing alignment circuit and configured to drive biasing signals to the reference frequency divider circuit and the timing alignment circuit.

12. The apparatus of claim 11, wherein the bias circuit is configured to drive the biasing signals to respective control terminals of the delay component of the timing alignment circuit, wherein each of the biasing signals is driven with a first bias voltage that corresponds to a second bias voltage sent to a corresponding delay component on the reference signal path.

13. A clock generation system, comprising:
a reference frequency divider circuit coupled to an input terminal and configured to receive a reference frequency signal, and to generate a frequency-divided reference signal;
a phase-locked loop (PLL) circuit configured to receive the frequency-divided reference signal and to provide a frequency-divided feedback signal along a feedback signal path to an input to the PLL, and an output oscillation signal to an output terminal;
an output frequency divider configured to receive the output oscillation signal and generate a frequency-divided output timing signal that is a function of a frequency of the reference frequency signal; and
a timing alignment circuit coupled to the PLL circuit and comprising a delay component that replicates an amount of path delay through the reference signal path of the reference frequency divider circuit, wherein the timing alignment circuit is configured to adjust a phase of the frequency-divided feedback signal with a specified amount of delay that is proportional to the amount of path delay through a reference signal path of the reference frequency divider circuit to align the frequency-divided reference signal to the frequency-divided feedback signal.

14. The clock generation system of claim 13, wherein the PLL circuit comprises:
an error detector circuit configured to receive the frequency-divided reference signal and a frequency-divided feedback signal to provide an error signal;
a voltage controlled oscillator (VCO) circuit configured to receive the error signal and generate the output oscillation signal; and
a feedback divider circuit configured to receive the output oscillation signal from the VCO circuit and generate the frequency-divided feedback signal along a negative feedback path to the error detector circuit,
wherein the timing alignment circuit is coupled to an input to the error detector circuit.

15. The clock generation system of claim 14, wherein a path delay from an output of the VCO circuit through the output frequency, divider corresponds to a path delay from the output of the VCO circuit through the feedback divider circuit.

16. The clock generation system of claim 14, wherein the timing alignment circuit is coupled between the input terminal and a first input to the error detector circuit.

17. The clock generation system of claim 14, wherein the timing alignment circuit is coupled between an output of the VCO circuit and a second input to the error detector circuit.

18. The clock generation system of claim 17, wherein the timing alignment circuit is coupled to an output of the feedback divider circuit and to the second input of the error detector circuit.

19. The clock generation system of claim 17, wherein the timing alignment circuit is coupled to the output of the VCO circuit and to an input to the feedback divider circuit.

20. An apparatus for timing alignment to a common reference signal, the apparatus comprising:
    means for receiving a reference frequency signal at an input terminal and providing a frequency-divided reference signal along a reference signal path from the input terminal;
    means for receiving the frequency-divided reference signal and providing a frequency-divided feedback signal along a feedback signal path and an output oscillation signal to an output terminal; and
    means for replicating an amount of path delay from the input terminal through the reference signal path with a delay component arranged along the feedback signal path, adjusting a phase of the frequency-divided feedback signal with a specified amount of delay that is proportional to the amount of path delay through the reference signal path and aligning the frequency-divided reference signal to the frequency-divided feedback signal with the adjusted phase such that a transition edge of the frequency-divided feedback signal is aligned with a transition edge of the frequency-divided reference signal.

21. An apparatus for timing alignment to a common reference signal, the apparatus comprising:
    means for receiving a reference frequency signal at an input terminal along a reference signal path from the input terminal;
    means for providing a frequency-divided feedback signal along a feedback signal path based on the received reference frequency signal and providing an output oscillation signal to an output terminal; and
    means for replicating an amount of path delay along the feedback signal path with a delay component arranged along the reference signal path, adjusting a phase of the reference frequency signal with a specified amount of delay that is proportional to the amount of path delay through the feedback signal path and aligning the reference frequency signal to the frequency-divided feedback signal with the adjusted phase such that a transition edge of the reference frequency signal is aligned with a transition edge of the frequency-divided feedback signal.

22. The apparatus of claim 21, further comprising:
    means for providing a frequency-divided reference signal along the reference signal path based on the received reference frequency signal, wherein the means for providing the frequency-divided feedback signal is based on the frequency-divided reference signal.

23. The apparatus of claim 21, wherein the reference frequency signal is passed to an input of a phase-locked loop through the reference signal path at a same frequency as received at the input terminal.

\* \* \* \* \*